(12) United States Patent
Polman et al.

(10) Patent No.: US 6,433,399 B1
(45) Date of Patent: Aug. 13, 2002

(54) INFRARED DETECTOR DEVICE OF SEMICONDUCTOR MATERIAL AND MANUFACTURING PROCESS THEREOF

(75) Inventors: Albert Polman, Amsterdam; Nicholas Hamelin, Petten; Peter Kik, Amsterdam, all of (NL); Salvatore Coffa, Tremestieri Etneo (IT); Ferruccio Frisina, Sant'agata li Battiati (IT); Mario Saggio, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/415,022

(22) Filed: Oct. 7, 1999

(30) Foreign Application Priority Data

Oct. 9, 1998 (EP) .............................. 98830592

(51) Int. Cl.[7] ......................................... H01L 31/0232
(52) U.S. Cl. ..................... 257/432; 257/431; 257/470; 385/12; 385/14
(58) Field of Search ........................ 257/73, 431–433, 257/470; 385/12, 14

(56) References Cited

U.S. PATENT DOCUMENTS

| 4,857,973 A | | 8/1989 | Yang et al. ................... 257/73 |
| 4,884,112 A | * | 11/1989 | Lorenzo et al. ................ 257/86 |
| 5,206,925 A | * | 4/1993 | Nakaqawa et al. .......... 385/142 |
| 5,280,189 A | * | 1/1994 | Schuppert et al. ........... 257/458 |
| 5,563,979 A | | 10/1996 | Bruce et al. ................ 385/142 |
| 5,790,583 A | * | 8/1998 | Ho ................................ 372/92 |
| 5,878,070 A | * | 3/1999 | Ho et al. ........................ 372/92 |
| 5,936,762 A | * | 8/1999 | Samson et al. ............. 359/341 |
| 6,118,571 A | * | 9/2000 | Wessels et al. ............. 359/245 |

FOREIGN PATENT DOCUMENTS

| JP | 01140679 | 6/1989 |
| JP | 08204222 | 8/1996 |
| JP | 10125940 | 5/1998 |

OTHER PUBLICATIONS

Wu and Chu, "Fabrication of High Concentration Rare-Earth-Doped Silica-Based Waveguide by MCVD Method," *IEEE Photonics Technology Letters*, 7(6):655–657, Jun. 1995.

* cited by examiner

Primary Examiner—Allan R. Wilson
(74) Attorney, Agent, or Firm—Lisa K. Jorgenson; E. Russell Tarleton; SEED IP Law Group PLLC

(57) ABSTRACT

An infrared detector device having a PN junction formed by a first semiconductor material region doped with rare earth ions and by a second semiconductor material region of opposite doping type. The detector device comprises a waveguide formed by a projecting structure extending on a substrate, including a reflecting layer and laterally delimited by a protection and containment oxide region. At least one portion of the waveguide is formed by the PN junction and has an end fed with light to be detected. The detector device has electrodes disposed laterally to and on the waveguide to enable efficient gathering of charge carriers generated by photoconversion.

31 Claims, 3 Drawing Sheets

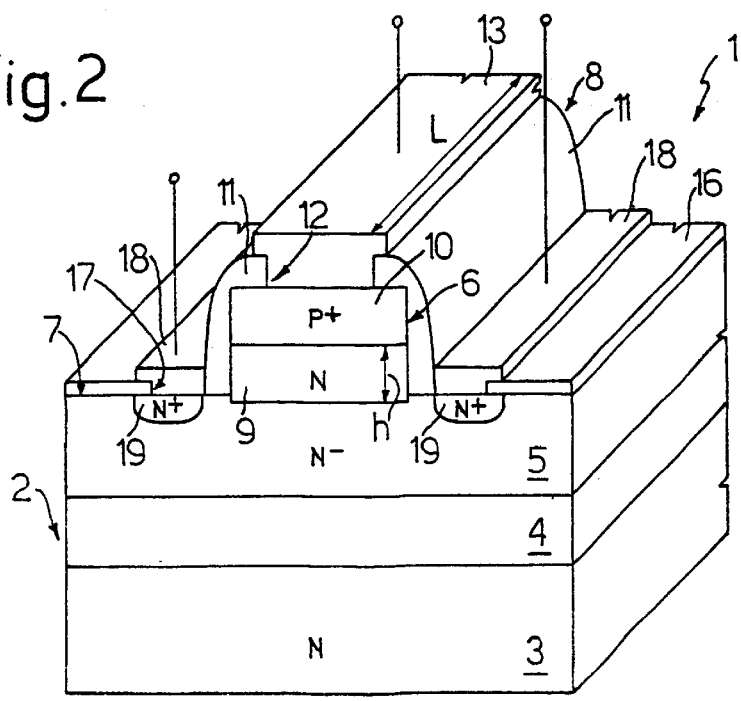

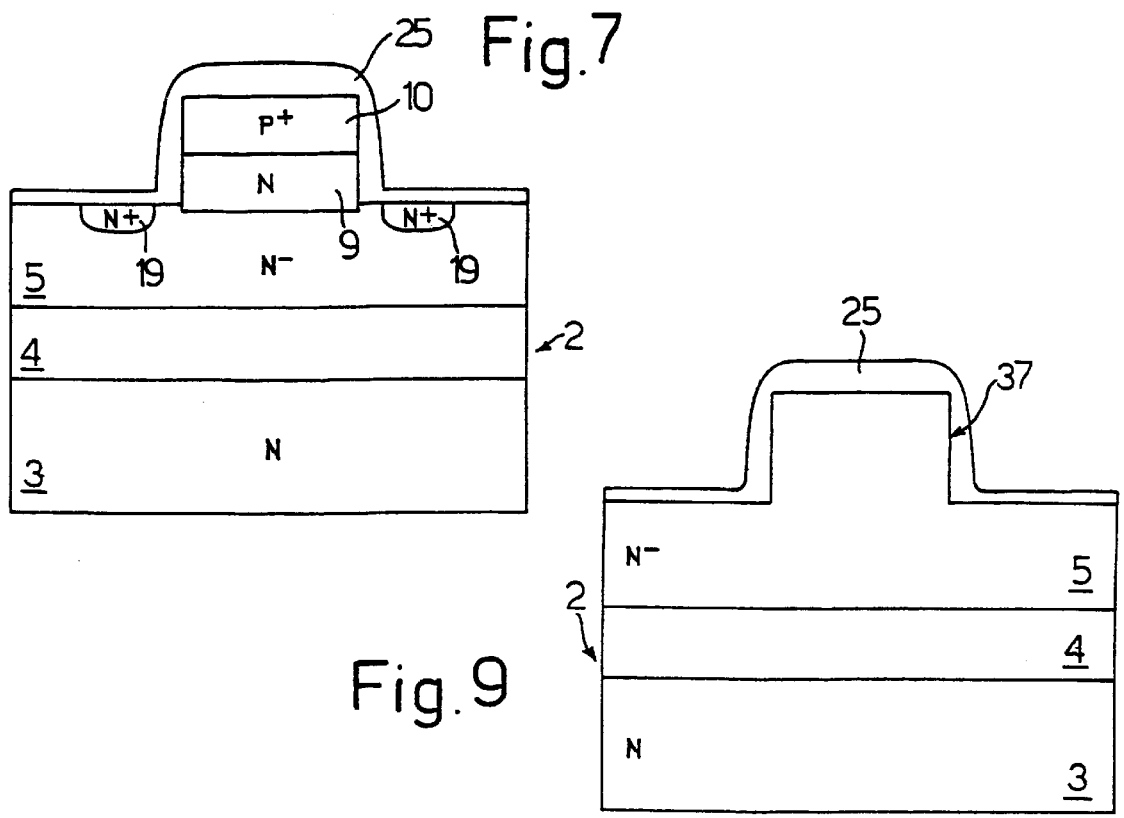
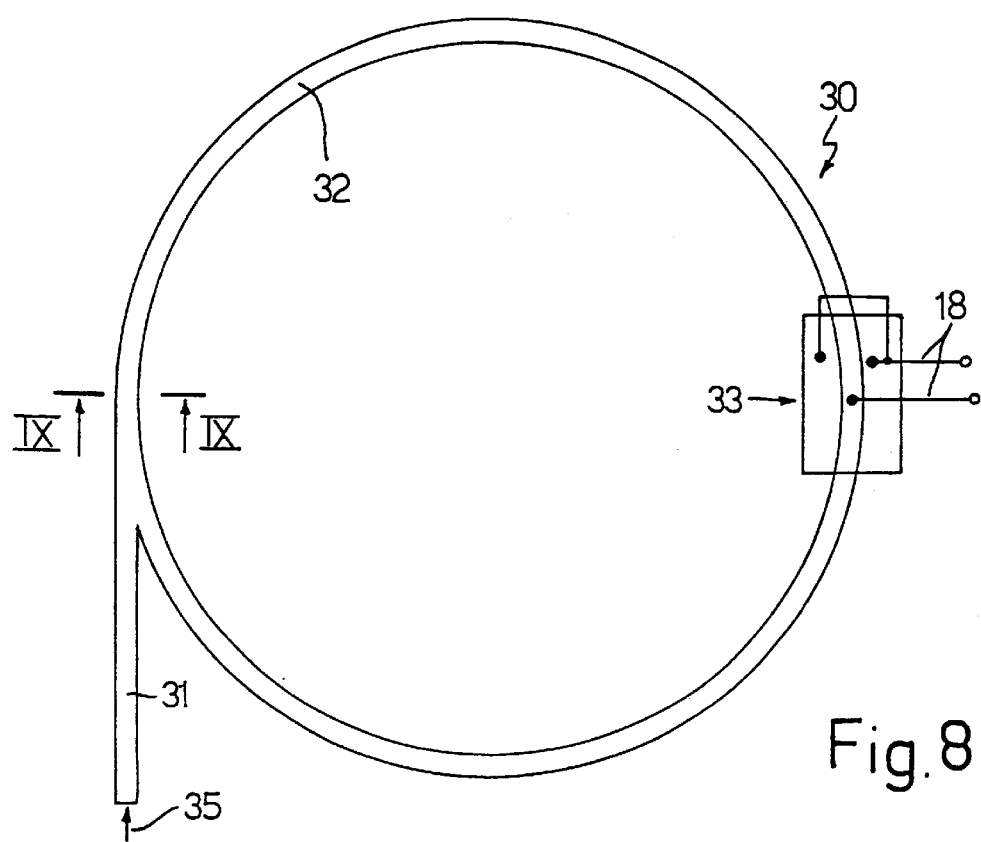

INFRARED DETECTOR DEVICE OF SEMICONDUCTOR MATERIAL AND MANUFACTURING PROCESS THEREOF

TECHNICAL FIELD

The present invention relates to an infrared detector device of semiconductor material and the manufacturing process thereof.

BACKGROUND OF THE INVENTION

As known, silicon is currently the main material for producing integrated electronic components, and a wide variety of electrical functions may be implemented using silicon-based devices.

A new optical communications technology is emerging wherein the elementary information is carried by optical signals. Wavelengths in optical communication technology are typically between 1.3 and 1.55 μm. It is therefore desirable to bring optical and electronic functions together in a single silicon device, combining electronic and optical technologies.

To this end significant progress has been made in fabricating silicon optical devices operating at wavelengths in the near infrared range: in particular, low-loss optical waveguides have been developed; the producibility of light-emitting diodes of planar structure based on doping with erbium ions has been proved; and optical silicon switches based on an electro-optical effect have been fabricated. There are, however, no infrared silicon-based detectors operating at wavelengths greater than 1.1 μm, the wavelength associated with the silicon band-gap. Silicon does not absorb light at wavelengths in excess of 1.1 μm. This property may be advantageously exploited to produce transparent optical waveguides of low loss at wavelengths greater than 1.1 μm, but it makes silicon unsuitable for detecting light in the infrared range.

Two approaches have been proposed for modifying the properties of silicon and allowing the production of an infrared detector: the deposition of germanium (Ge) or silicon-germanium ($Si_xG_{1-x}$) layers on silicon, and the deposition of thin metal layers on silicon to form Schottky diodes and thus produce detectors operating by internal photoemission. Neither solution is satisfactory, however. Germanium or silicon-germanium layers are subject to mechanical stress and faults. Furthermore, the quantum efficiency of such devices at room temperature is low. Devices based on metal/semiconductor barriers also have low quantum efficiency at room temperature and they have high noise because of thermoionic emission.

It has also been demonstrated that ions of rare earths, incorporated into silicon in the trivalent state, exhibit well-defined electron transitions due to an incomplete 4f shell. For example, erbium incorporated in a trivalent state has a first excited state at 0.8 eV (corresponding to 1.54 μm) with respect to the ground state. This transition energy depends on the specific rare earth ions (equal, for example, to approximately 1.2 eV for ytterbium Yb, 1.16 eV for holmium Ho and 1.37 eV for neodymium Nd). These transitions may be excited both optically and electrically by a charge carrier mediated process.

Hereinafter, reference is made to optical excitation that takes place when a photon with an energy resonant with the transition energy of rare earth ions produces the excitation of the ion from its ground state to its first excited state. This process is shown diagrammatically in FIGS. 1a–1c in the specific case of erbium. In FIG. 1a, a photon with an energy of 1.54 μm and incident on an erbium-doped region is absorbed by and excites an erbium ion. The excited erbium ion may then become de-excited, transferring its energy to the semiconductor electron system. In the example shown, during de-excitation the erbium ion gives up its energy to an electron at the top of the valency band (energy $E_v$), bringing it to a defect level $E_T$ in the silicon band gap, also due to the energy contribution provided by the phonons supplying the extra energy required to reach level $E_T$ (FIG. 1b). This passage is thus more efficient at high temperature. It may then happen that the electron at the defect level absorbs thermal energy such as to cause it to pass from defect level $E_T$ to conduction band $E_C$ (FIG. 1c). Overall, in the process shown, absorption of a photon at 1.54 μm leads to generation of a free hole-electron pair. This hole-electron pair may then be separated and gathered by the electric field present in the region accommodating the rare earth ion, thus giving rise to an electric current that may be detected and is directly proportional to the intensity of infrared light.

The above-described process for converting infrared light into electrical current has been demonstrated in silicon solar cells doped with erbium for which photocurrents have been obtained at wavelengths of approx. 1.54 μm. The conversion efficiency in such cells is, however, very low, on the order of 1E–6, which is insufficient for implementation in commercial devices.

SUMMARY OF THE INVENTION

The invention provides an infrared detector exploiting the conversion principle above described and having greater efficiency than present efficiency.

BRIEF DESCRIPTION OF THE DRAWINGS

For an understanding of the present invention, preferred embodiments will now be described, purely by way of non-exhaustive example, with reference to the accompanying drawings wherein:

FIGS. 1a, 1b and 1c show the principle of photoconversion used in the present detector.

FIG. 2 shows a cross-sectional perspective view of a first embodiment of the present detector.

FIGS. 3–7 show cross-sections through the detector of FIG. 2, in successive production phases.

FIG. 8 shows a top view of a second embodiment of the present detector.

FIG. 9 is a cross-section through IX—IX of FIG. 8.

DETAILED DESCRIPTION OF THE INVENTION

Figure 3:
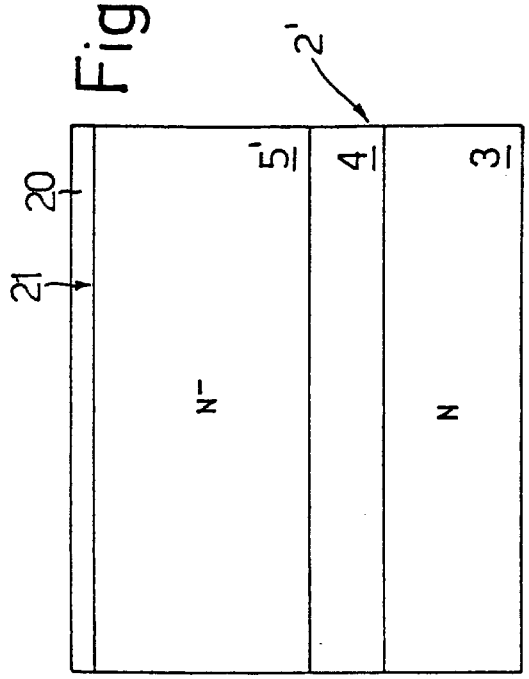

The invention in one form is directed to making a waveguide doped in at least one of its portions with rare earth ions and having one of its ends supplied with light to be detected. The waveguide has suitable electrodes to permit an efficient gathering of charge carriers generated by photoconversion.

Referring to FIG. 2, the detector is made using an SOI (Silicon-On-Insulator) substrate 2 formed by a first N-type single-crystal region 3, an oxide region 4 and a second $N^-$-type single-crystal region 5.

A guide structure 8 of rectilinear shape extends on the upper surface 7 of SOI substrate 2 and comprises a projecting region 6 surrounded laterally and at the top by a protection and containment region 11. In detail, projecting region 6 comprises a channel region 9, of N-type erbium-doped single-crystal silicon, contiguous with second single-crystal region 5 and a P-type conductive region 10, of boron-doped single-crystal silicon, having the same shape and extending exactly on channel region 9. Channel region 9 and conductive region 10 form a PN junction. Protection and containment region 11 is of silicon oxide and has an opening 12 for direct electrical contact between conductive region 10 and a first metal region 13, forming a first electrode of detector 1.

A cover layer 16 of silicon oxide extends on the upper surface 7 of SOI substrate 2, laterally to the guide structure 8. Cover layer 16 has two openings 17 extending on the sides of the guide structure 8 and accommodating second metal regions 18 forming second electrodes of detector 1. Second metal regions 18 are in direct electrical contact with N-type contact regions 19 formed in the second single-crystal region 5 laterally to the guide structure 8. First electrode 13 and second electrodes 18 bias the PN junction formed by channel and conductive regions 9, 10 at a suitable reverse voltage, such as 2 V to 10 V, which separates the hole-electron pairs formed by photoconversion and attracts holes and electrons thus separated towards the respective electrodes 13, 18, giving rise to an electric current proportional to the intensity of light energy provided at the input of the waveguide structure 8.

In the detector 1 of FIG. 2, light is injected into the guide structure 8 at one of its ends to interact with erbium ions present in channel region 9. The guide structure 8 has a length of between a few millimeters and a few centimeters to form a relatively long path for light. Generally speaking, the length L of the waveguide is equal to a multiple of the height of channel region 9, for example at least ten times, and typically 300–400 times. The length of the guide structure allows a relatively long interaction between light and erbium ions, increasing the likelihood of optical absorption by the erbium ions with respect to the case of a known PN planar junction. Furthermore, since silicon waveguides may be produced with low losses and a small curve radius, it is possible to integrate very long waveguides in a very small area.

In the structure of FIG. 2, protection and containment regions 11 and oxide layer 4, in view of the lower refraction index than silicon, operate like waveguide side walls, preventing scattering and absorbing of the light outside the device and thus increasing photon and photoconversion capture efficiency.

The disposition of electrodes 18, 13 along the entire waveguide further allows an efficient gathering of the generated energy.

The detector of FIG. 2 may be made with the manufacturing process described below with reference to FIGS. 3–7. In particular, an SOI wafer, denoted by 2', is initially made, comprising first single-crystal region 3, oxide region 4 and a second single-crystal region 5' of a thickness equal to the sum of the thicknesses of region 5 and channel 9 and conductive regions 10 of FIG. 2. The SOI wafer 2' may be obtained by any known technique, such as SIMOX (Separation by IMplantation OXygen), based on implanting oxygen atoms at high doses, or BESOI (Bond and Etchback SOI) based on bonding two wafers of single-crystal silicon, one of which has been previously oxidized on the bonding side, and thinning the other silicon wafer to the desired thickness.

Figure 4:
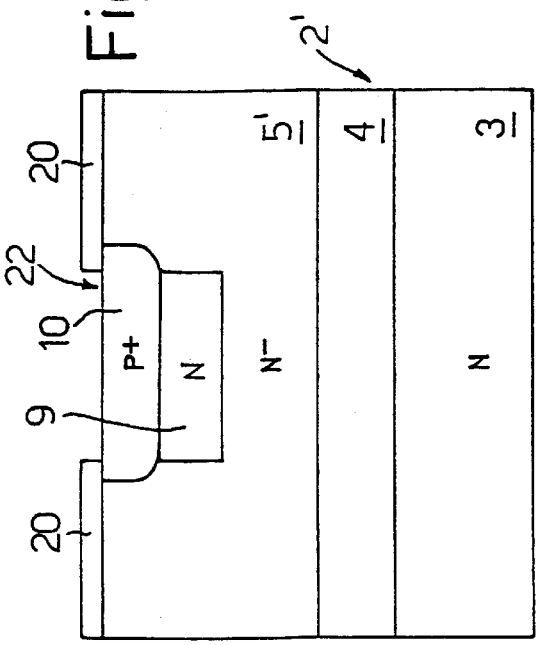

On surface 21 of wafer 2' a layer of silicon oxide 20 is then grown, forming the structure shown in FIG. 3. Using a suitable mask (not shown), an opening 22 is then formed in silicon oxide layer 20, and boron ions are implanted through opening 22 to form conductive region 10. Then, using the same mask, rare earth ions, such as erbium, are implanted, forming channel region 9 which, given the implant characteristics (and following a suitable thermal phase), forms underneath the conductive region 10. Alternatively channel region 9 may be formed using molecular beam epitaxy or by chemical vapor deposition. After removing the mask, the intermediate structure of FIG. 4 is thus obtained.

Figure 5:
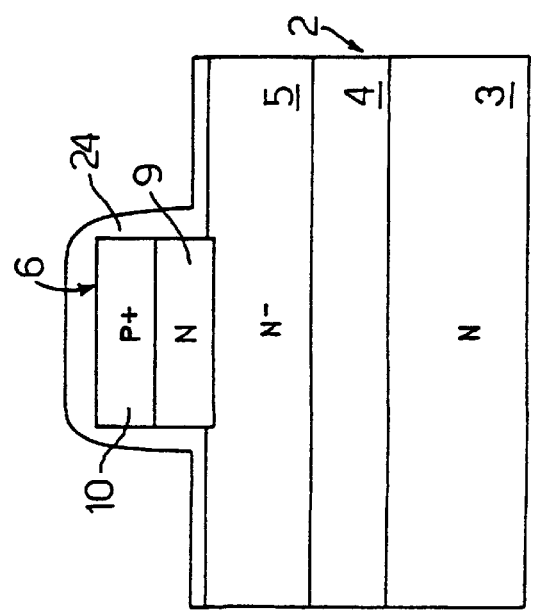

Subsequently, using a suitable mask covering the zone of channel 9 and conductive regions 10, the projecting region 6 is defined; in this phase the oxide layer 20 and part of the second single-crystal region 5' are then removed as far approximately as the lower edge of channel region 9. A silicon oxide layer 24 covering all the surface of wafer 2, particularly the projecting region 6, is then deposited or grown. The intermediate structure of FIG. 5 is thus obtained.

Figure 6:
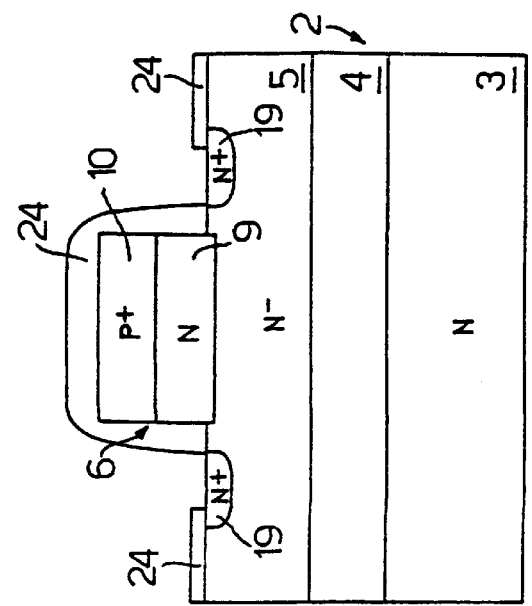

Using a suitable mask not shown, part of silicon oxide layer 24 is removed from the zone where contact regions 19 are to be formed, and N-type dopants, such as arsenic, are implanted, forming contact regions 19. After removing the mask, the structure of FIG. 6 is obtained.

A further silicon oxide layer is then deposited, to obtain a layer 25 covering the projecting region 6 and the surface 7 of the wafer 2, with the thickness equal to the desired thickness for cover layer 16 and protection and containment regions 11. The structure of FIG. 7 is thus obtained, wherein oxide layer 25 is not to scale with oxide layer 24.

Using a suitable mask (not shown), contacts with conductive region 10 and contact regions 19 are then opened, forming openings 12 and 17. Oxide layer 25 thus forms containment and protection region 11 and cover layer 16. Finally, after mask removal, a metal layer is deposited and then defined by photolithography to form electrodes 13, 18 of the detector. The final structure of FIG. 2 is thus obtained.

FIGS. 8 and 9 show a variant of detector 1 of FIG. 2. In particular, according to FIG. 8, the detector 30, has an annular shape and is formed by an input section 31, rectilinear, for the light to enter (shown diagrammatically by arrow 35 in the drawing) and a ring section 32 forming a capture portion 33. Input section 31 and ring section 32 (apart from capture portion 33) have the structure shown in the section of FIG. 9. In particular they are formed by a projecting region 37 of the same material and doping as single-crystal region 5. The projecting region 37 is covered by a silicon oxide layer, indicated with reference number 25 for uniformity with FIG. 7. Consequently projecting region 37 has neither doped regions 9, 10 nor contact regions 19. Capture portion 33 has exactly the structure of FIG. 2, with projecting region 6 placed in continuation of projecting region 37.

The detector 30 of FIG. 8 has even greater efficiency than detector 1 of FIG. 2, since it causes light entering the input section 31 to rotate several times in the annular section of the waveguide, encountering several times the capture portion 33 accommodating the channel region 9. Consequently the probability of photon absorption by erbium atoms and the resulting photoconversion described above is multiplied.

The dimensions of projecting regions 6, 37, particularly the relationship between the length of capture portion 33 and the total length (circumference) of ring section 32, may be optimized, taking into account the waveguide loss as a function of the curve radius, to obtain the best possible signal/noise ratio.

The detector 30 of FIG. 8 has even greater efficiency than detector 1 of FIG. 2, since it causes input section 31 to rotate several times in the annular section of the waveguide, encountering several times the capture portion 33 accommodating the channel region 9. Consequently the probability of photon absorption by erbium atoms and the resulting photoconversion described above is multiplied.

Finally, it will be clear that many modifications and variants may be introduced to the detector and the manufacturing process described herein, all of which come within the scope of the invention, as defined in the accompanying claims. In particular, the detector may be made with a different semiconductor material; it is possible to use germanium, gallium arsenide etc. instead of silicon for example.

Furthermore, channel region 9 may be doped, instead of with erbium, with other materials, such as other rare earths including ytterbium, holmium, neodymium and praseodymium or transition metals, to obtain sensitivity of the detector to different light wavelengths. Channel region 9 may also be doped with rare earth ions, with additional impurities acting as sensitizers, such as ytterbium, having transitions resonant with rare earth ions. In fact such additional impurities can absorb infrared photons passing through the waveguide and subsequently give up their energy to the rare earth ions by energy transfer, increasing the overall impact excitation cross-section by infrared photons.

Instead of SOI-type, the substrate accommodating the detector may comprise a double semiconductor material layer with different doping level, and more precisely a heavily doped lower layer and an upper more lightly doped epitaxial layer. In this case, the lower, more doped layer has a lower refraction index than the epitaxial layer and, if incident light is suitably angled, acts as a reflecting layer, similar to oxide layer 4. Although this solution is less efficient compared with the use of an SOI substrate, it has much lower manufacturing costs. Instead of being PN-type, the junction may be a Schottky junction, formed by a semiconductor material layer doped with rare earth ions and by an overlying metal layer, replacing the conductive region 10.

Finally, the form of the waveguide may differ from that shown. It may, for example, have a coil shape or another open or closed shape that increases the effective length per unit of occupied area.

What is claimed is:

1. An infrared detector device, comprising:
    a junction formed by at least a first semiconductor material region doped with rare earth ions, the junction comprising a waveguide formed by at least one portion of said first semiconductor material region, the waveguide configured to receive infrared light at an input; and
    contact regions coupled to the waveguide for conducting electrical current generated in response to the received infrared light.

2. The device of claim 1 wherein said rare earth ions are selected from the group comprising erbium, ytterbium, holmium, neodymium and praseodymium.

3. The device of claim 1 wherein said first semiconductor material region further comprises sensitizing impurities that comprise ions having internal transitions resonant with rare earth ions.

4. The device of claim 3 wherein said sensitizing impurities comprise ytterbium.

5. The device of claim 1 wherein said junction comprises a second semiconductor material region doped with ions suitable for conferring conductivity of opposite type with respect to said rare earths.

6. The device of claim 1 wherein said junction comprises a Schottky diode.

7. The device of claim 1 wherein said waveguide has a length equal to a multiple of its height.

8. The device of claim 1 wherein said waveguide has a length that is equal to at least ten times the height of said waveguide.

9. The device of claim 1 wherein said waveguide is rectilinear.

10. The device of claim 1 wherein said waveguide has a closed form connected to an input section.

11. The device of claim 10 wherein said waveguide comprises a capture portion comprising said first semiconductor material region disposed inside and in continuation of a guide region not doped with rare earth ions.

12. The device of claim 1 wherein said waveguide is formed by a projecting structure extending on a substrate of semiconductor material.

13. The device of claim 12, comprising:
    a protection and containment region above and laterally enveloping said projecting structure except a contact opening, said protection and containment region formed of a material having a refractive index lower than the semiconductor material of said first semiconductor material region;
    said substrate further comprising at least a third semiconductor material region in direct electrical contact with said projecting structure and a reflecting region underneath said third semiconductor material region; and
    further comprising contact regions extending in said third semiconductor material region laterally to said projecting structure.

14. The device of claim 13 wherein said substrate comprises an SOI substrate and said reflecting region is formed by oxide.

15. The device of claim 13 wherein said reflecting region comprises a fourth semiconductor material region having a higher doping level than said third semiconductor material region.

16. An infrared detector device, comprising:
    a waveguide formed on a substrate, the waveguide having at least a first layer of semiconductor material doped with rare earth ions;
    a first electrode structure in electrical contact with and encapsulating a portion of the waveguide;
    a second electrode structure electrically coupled to another portion of the waveguide; and
    a non-conductive containment region enveloping a further portion of the waveguide.

17. The device of claim 16 wherein the waveguide comprises a second layer of semiconductor material doped with ions of opposite conductivity type than the rare earth ions, the first and second layers of the waveguide forming a PN junction.

18. The device of claim 16 wherein the rare earth ions are selected from the group comprising erbium, ytterbium, holmium, neodymium, and praseodymium.

19. The device of claim 17 wherein the first layer of semiconductor material comprises sensitizing impurities comprising ions having internal transitions resonant with rare earth ions.

20. The device of claim 19 wherein the sensitizing impurities comprise ytterbium.

21. The device of claim 16 wherein the waveguide comprises a first layer and a second layer, and wherein the first electrode structure is connected to one of the first and second layers, and the second electrode structure is coupled to the other of the first and second layers.

22. The device of claim 21 wherein the containment region is formed of a material having a refractive index lower than a refractive index of the waveguide.

23. The device of claim 22, further comprising a third layer of semiconductor material in direct electrical contact with the waveguide, the third layer of semiconductor material is positioned below the waveguide, and further comprising a reflecting region underneath the third layer of semiconductor material.

24. The device of claim 23 wherein the substrate comprises an SOI substrate and the reflecting region is formed by oxide.

25. An infrared detector device, comprising:
  a junction formed by at least a first semiconductor material region doped with rare earth ions, the junction comprising a waveguide formed by at least one portion of the first semiconductor material region and by a projecting structure extending on a substrate of the semiconductor material;
  a protection and containment region above and laterally enveloping said projecting structure except a contact opening, said protection and containment region formed of a material having a refractive index lower than the semiconductor material of said first semiconductor material region;
  said substrate further comprising at least a third semiconductor material region in direct electrical contact with said projecting structure and a reflecting region underneath said third semiconductor material region; and
  contact regions extending in said third semiconductor material region laterally to said projecting structure.

26. An infrared detector device, comprising:
  a junction formed by at least a first semiconductor material region doped with rare earth ions, the junction comprising a waveguide formed by at least one portion of the first semiconductor material region and by a projecting structure extending on a substrate of the semiconductor material, the substrate comprising an SOI substrate and the reflecting region formed by oxide;
  a protection and containment region above and laterally enveloping said projecting structure except a contact opening, said protection and containment region formed of a material having a refractive index lower than the semiconductor material of said first semiconductor material region;
  said substrate further comprising at least a third semiconductor material region in direct electrical contact with said projecting structure and a reflecting region underneath said third semiconductor material region; and
  contact regions extending in said third semiconductor material region laterally to said projecting structure.

27. An infrared detector device, comprising:
  a junction formed by at least a first semiconductor material region doped with rare earth ions, the junction comprising a waveguide formed by at least one portion of the first semiconductor material region and by a projecting structure extending on a substrate of the semiconductor material, the substrate comprising an SOI substrate and the reflecting region formed by oxide;
  a protection and containment region above and laterally enveloping said projecting structure except a contact opening, said protection and containment region formed of a material having a refractive index lower than the semiconductor material of said first semiconductor material region;
  said substrate further comprising at least a third semiconductor material region in direct electrical contact with said projecting structure and a reflecting region underneath said third semiconductor material region, the reflecting region comprising a fourth semiconductor material region having a higher doping level than the third semiconductor material region; and
  contact regions extending in said third semiconductor material region laterally to said projecting structure.

28. An infrared detector device, comprising:
  a waveguide formed on a substrate, the waveguide comprising a first layer of semiconductor material doped with rare earth ions and a second layer;
  a first electrode structure in electrical contact with and encapsulating a portion of the waveguide, the first electrode structure connected to one of the first and second layers;
  a second electrode structure electrically coupled to the other of the first and second layers;
  a non-conductive containment region enveloping a further portion of the waveguide, the containment region comprising a material having a refractive index lower than a refractive index of the waveguide; and
  a third layer of semiconductor material in direct electrical contact with the waveguide, the third layer of semiconductor material positioned below the waveguide and further comprising a reflecting region underneath the third layer of semi-conductor material.

29. An infrared detector device comprising:
  a waveguide formed on a substrate, the substrate comprising an SOI substrate, the waveguide comprising a first layer of semiconductor material doped with rare earth ions and a second layer;
  a first electrode structure in electrical contact with and encapsulating a portion of the waveguide, the first electrode structure connected to one of the first and second layers;
  a second electrode structure electrically coupled to the other of the first and second layers;
  a non-conductive containment region enveloping a further portion of the waveguide, the containment region comprising a material having a refractive index lower than a refractive index of the waveguide;
  a third layer of semiconductor material in direct electrical contact with the waveguide, the third layer of semiconductor material positioned below the waveguide; and
  a reflecting region underneath the third layer of semiconductor material, the reflecting region being formed by oxide.

30. An infrared detector device, comprising:
  an input to receive infrared light energy;
  a waveguide configured to receive the infrared light energy from the input and comprising at least a first layer of semiconductor material doped with rare earth ions; and
  a current gathering region electrically coupled to the waveguide and configured to conduct electrical current as output.

31. An infrared detector device, comprising:

a waveguide having a light-receiving input and comprising at least a first layer of semiconductor material doped with rare earth ions for conducting light received at the light-receiving input; and a current gathering output coupled to the waveguide and configured to conduct electrical energy generated by the light in the waveguide.

* * * * *